United States Patent [19]

Rösner

[11] Patent Number: 5,496,757
[45] Date of Patent: Mar. 5, 1996

[54] PROCESS FOR PRODUCING STORAGE CAPACITORS FOR DRAM CELLS

[75] Inventor: Wolfgang Rösner, München, Germany

[73] Assignee: Siemens Aktiengesellschaft, Munich, Germany

[21] Appl. No.: 351,464

[22] PCT Filed: Jun. 15, 1993

[86] PCT No.: PCT/DE93/00516

§ 371 Date: Dec. 6, 1994

§ 102(e) Date: Dec. 6, 1994

[87] PCT Pub. No.: WO94/01891

PCT Pub. Date: Jan. 20, 1994

[30] Foreign Application Priority Data

Jul. 8, 1992 [DE] Germany .......................... 42 22 467.5

[51] Int. Cl.$^6$ .............................................. H01L 21/8242
[52] U.S. Cl. ................................ 437/52; 437/60; 437/919
[58] Field of Search ................................ 437/47, 48, 52, 437/60, 919; 257/306, 308

[56] References Cited

U.S. PATENT DOCUMENTS 5,281,549  1/1994  Fazan ........................................ 437/60

FOREIGN PATENT DOCUMENTS 0286270  12/1987  Japan .

Primary Examiner—Tom Thomas
Attorney, Agent, or Firm—Hill, Steadman & Simpson

[57] ABSTRACT

To produce storage capacitors for DRAM cells, dummies (81) of $SiO_2$ which are disposed in accordance with the negative pattern of the storage node arrangement (91) are formed using auxiliary layers of $SiO_2$ and polysilicon. The storage nodes (91) are formed, by depositing a doped polysilicon layer over the entire surface and structuring it, in such a way that they cover the area inside the dummies (81) and the side walls of the dummies (81) and that the surface of the dummies (81) is exposed in their upper region. After removing the dummies (81), a storage dielectric and a cell plate are formed. The process can be used in the production of a stacked-capacitor DRAM cell.

9 Claims, 4 Drawing Sheets

PROCESS FOR PRODUCING STORAGE CAPACITORS FOR DRAM CELLS

BACKGROUND OF THE INVENTION

A stacked-capacitor DRAM cell comprises an MOS transistor and a storage capacitor, the MOS transistor being disposed in a silicon substrate and the storage capacitor comprising two doped polysilicon layers and a dielectric layer disposed inbetween, said layers being disposed at the surface of the substrate. In this arrangement the storage capacitor completely or partly spans that area which is covered by the transistor.

In order to increase the capacitance of the storage capacitor further for the same size of the area covered on the substrate and, consequently, to reduce the area required on the substrate for constant capacitance of the storage capacitor, it has been proposed to construct the storage capacitor cylindrically. For this purpose, the storage node, i.e. that electrode of the storage capacitor on which the information is stored in the form of charge, is cylindrically constructed. In addition to the base area, which is disposed at the surface of the substrate, it comprises an upwardly projecting lateral area. The dielectric layer is disposed on the surface of the base area and on the inside and outside of the surface of the lateral area. The cell plate, i.e. the second electrode of the storage capacitor, is then disposed on the surface of the dielectric layer. In this way, the area of the capacitor can be radically increased compared with the area required on the substrate.

To produce the storage capacitor, an auxiliary layer is first prepared on the surface of the substrate. Openings are made in said auxiliary layer. To form the storage nodes, a thin layer of doped polysilicon is deposited on the auxiliary layer having the openings. That part of the polysilicon layer deposited on the side walls and the base of the openings forms the subsequent storage nodes. The side walls of the openings should therefore be as vertical as possible.

After forming the storage nodes by removing the component of the polysilicon layer on the surface of the auxiliary layer and after removing the auxiliary layer, a storage dielectric is deposited over the entire surface. This extends both on the inside areas and on the outside areas of the free-standing lateral part of the storage node. The cell plate is then deposited over the entire surface as counterelectrode.

The auxiliary layer is deposited on the surface of the substrate, in which surface the MOS transistors have previously been produced. Between the storage nodes and the respective active regions of the associated transistors, a cell contact has to be made. This may follow directly or via additional, electrically conducting structures. Before the deposition of the auxiliary layer, the surface of the substrate is, as a rule, covered with an insulating layer. During the production of the opening in the auxiliary layer, it is necessary to ensure that an uncontrolled structuring of the insulating layer situated underneath the auxiliary layer does not occur. If, in addition to the cell contacts, holes extending to still other conductive regions are produced in the insulating layer during the production of the openings, these result in short circuits to the storage nodes subsequently formed. This should be avoided.

To solve this problem, it is known from W. Wakamiya et al., Symp. on VLSI Technology 1989, p.69, to form a polysilicon underlayer, in the region of the storage nodes, under the auxiliary layer which is formed from $SiO_2$. This underlayer is produced before depositing the auxiliary layer by depositing a polysilicon layer over the entire surface and then structuring using a photoresist mask. The size of the polysilicon underlayer is dimensioned in such a way that the $SiO_2$ etching to form the opening in the auxiliary layer certainly encounters it. The polysilicon underlayer acts as an etch stop in this etching process. The polysilicon underlayer remains in the storage cell as part of the subsequent storage node.

From Y. Kawamoto et al., Symp. on VLSI Technology 1990, p.13, it is known to form the auxiliary layer from polyimide. The production of the openings in the auxiliary layer is then not critical since polyimide can be etched with good selectivity with respect to $SiO_2$. To produce the storage nodes, a polysilicon layer is deposited on the surface of the polyimide auxiliary layer after producing suitable openings. Because of the low thermal stability of the polyimide, the temperature has to be limited during the polysilicon deposition.

From T. Kaga et al., IEEE Trans. Electr. Dev., vol.38, 1991, p.255, it is known to use a composite layer of $Si_3N_4$ and $SiO_2$ as auxiliary layer. The openings are formed in the $SiO_2$ and in the $Si_3N_4$. A special plasma etching process which etches with a selectivity of 40:1 relative to $SiO_2$ is necessary to form the opening in the $Si_3N_4$.

SUMMARY OF THE INVENTION

The invention is based on the problem of providing for the production of storage capacitors for DRAM cells, a further process which is suitable for use in the production of a stacked-capacitor DRAM cell and in which an uncontrolled exposure by etching of electrically conducting structures in the substrate is avoided with certainty in the production of openings in an auxiliary layer disposed on the surface of the substrate.

This problem is solved, according to the invention, by a process for producing storage capacitors for DRAM cells, in which a first auxiliary layer of polysilicon is deposited over the entire surface of a substrate provided over the entire surface with $SiO_2$. The first auxiliary layer is structured in accordance with the arrangement of the storage capacitors, so that it has openings which extend in each case between storage nodes of adjacent storage capacitors. A second auxiliary layer of $SiO_2$ is deposited over the entire surface, in which process the openings in the first auxiliary layer are filled with $SiO_2$. The second auxiliary layer is back-etched selectively with respect to the first auxiliary layer, so that the surface of the first auxiliary layer is exposed and dummies of $SiO_2$ are left behind in the openings. The first auxiliary layer is completely removed selectively with respect to $SiO_2$. A doped polysilicon layer is deposited over the entire surface and is structured to form storage nodes in such a way that the area inside the dummies and the side walls of the dummies are covered with the storage nodes and the surface of the dummies is in each case exposed in the upper region of the dummies. The dummy is essentially removed selectively with respect to the storage nodes. A storage dielectric is produced over the entire surface and a conductive layer is produced as cell plate.

In this process, a first auxiliary layer of polysilicon is deposited over the entire surface of a substrate provided over the entire surface with $SiO_2$. Transistors and, possibly, electrical connecting elements are produced in the substrate beforehand. The first auxiliary layer is structured in accordance with the arrangement of the storage capacitors, so that it has openings which extend in each case between storage nodes of adjacent storage capacitors. A second auxiliary layer of $SiO_2$ is deposited over the entire surface, in which process the openings in the first auxiliary layer are filled with $SiO_2$. $SiO_2$ can be etched with good selectivity with respect to polysilicon, so that, in a selective etching process, the surface of the first auxiliary layer is exposed by back-etching the second auxiliary layer. $SiO_2$ is left behind as a dummy in the openings. The first auxiliary layer is completely removed selectively with respect to $SiO_2$, with the result that the dummies remain intact.

The process procedure prior to the deposition of the first auxiliary layer preferably has the result that a conductive structure for connecting the storage nodes is covered only by a thin layer of $SiO_2$. This layer is removed by a short back-etching of $SiO_2$ over the entire surface.

The storage nodes are formed by depositing a doped polysilicon layer over the entire surface and exposing the surface of the dummies in each case in the upper region of the dummies. In this way, the storage nodes completely cover the area inside the dummies and essentially the side walls of the latter. Storage nodes produced in this way are essentially cylindrical, the area inside the dummies forming the base area and the component of the polysilicon layer disposed on the side walls of the dummies forming the lateral area of a cylinder. After removing the dummies selectively with respect to the storage nodes, storage dielectric is produced over the entire surface and a conductive layer is produced as cell plate.

Since the first auxiliary layer is formed from polysilicon and $SiO_2$ is continuously present underneath the first auxiliary layer and because polysilicon can be etched with good selectivity with respect to $SiO_2$, there is no need to fear an uncontrolled exposure of electrical Structures underneath the $SiO_2$ surface during the formation of the openings in the first auxiliary layer.

The first auxiliary layer is structured using a photoresist mask. All further structurings can be carried out in a self-aligned manner, i.e. without a further photoresist mask. A photoresist mask would in any case be necessary to structure the storage nodes.

It is within the scope of the invention, in order to expose the surface in the upper region of the dummy, to use a photoresist layer which is removed by back-exposure and development only in the upper part of the dummies which are covered with the doped polysilicon layer.

The dummy is removed, for example, by an $SiO_2$ etching process, in which the amount removed by etching is adjusted by means of the etching time.

In order to have a more precise end-point control in the removal of the dummy, it is within the scope of the invention to provide an etch stop of $Si_3N_4$ underneath the dummy.

For this purpose, after structuring the first auxiliary layer prior to the deposition of the second auxiliary layer, an $Si_3N_4$ layer is deposited which is thinner than half the width of the openings in the first auxiliary layer. During the back-etching of the second auxiliary layer, the surface of the $Si_3N_4$ layer is exposed in the region of the first auxiliary layer. In an $Si_3N_4$ etching process which is selective with respect to polysilicon, the surface of the first auxiliary layer is then exposed. In this case, the dummies are surrounded by that component of the $Si_3N_4$ layer which surrounds them in the openings. After the formation of the storage nodes, the dummies are removed by an $SiO_2$ etching process which is selective with respect to $Si_3N_4$. An $Si_3N_4$ etching process is then carried out selectively with respect to polysilicon and $SiO_2$, in which process the remnants of the $Si_3N_4$ layer are completely removed.

Further embodiments of the invention are as follows

Prior to the deposition of the doped polysilicon layer for forming the storage nodes, there are opened in the $SiO_2$ at the surface of the substrate contact holes via which the storage nodes are electrically connected to electrically conducting structures disposed in the $SiO_2$ at the surface of the substrate.

After deposition of the doped polysilicon layer for forming the storage nodes, a photoresist layer is deposited which completely covers the doped polysilicon layer. The photoresist layer is back-exposed and developed, so that only the upper part of the dummies covered with the doped polysilicon layer is exposed. In an anisotropic dry etching process, the doped polysilicon layer is structured selectively with respect to $SiO_2$, in which process the horizontal areas of the dummies are exposed.

After structuring the first auxiliary layer prior to the deposition of the second auxiliary layer, an $Si_3N_4$ layer is deposited which is thinner than half the width of the openings in the first auxiliary layer. During the back-etching of the second auxiliary layer, the surface of the $Si_3N_4$ layer is exposed in the region of the first auxiliary layer.

An $Si_3N_4$ etching process is carried out selectively with respect to polysilicon, in which process the surface of the first auxiliary layer is exposed.

After forming the storage nodes the dummies are removed by an $SiO_2$ etching process which is selective with respect to $Si_3N_4$. An $Si_3N_4$ etching process is then carried out selectively with respect to polysilicon and $SiO_2$, in which process the remnants of the $Si_3N_4$ layer are removed.

The first auxiliary layer is structured using a photoresist mask in a dry etching process.

The second auxiliary layer is formed by conformal deposition.

The storage dielectric is formed as a multilayer of thermal $SiO_2$, $Si_3N_4$ and thermal $SiO_2$.

The cell plate is formed from doped polysilicon.

Prior to the deposition of the first auxiliary layer, transistors with bit lines and word lines for stacked-capacitor DRAM cells are produced in the substrate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
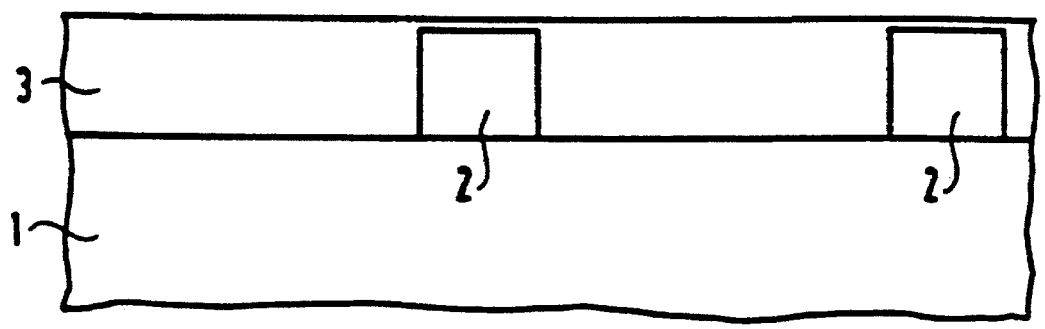
FIG. 1 shows a section through a substrate whose surface is provided over its entire area with $SiO_2$.

The process according to the invention proceeds from a substrate 1 (see FIG. 1) in which transistors for a DRAM cell arrangement have been produced beforehand. For the sake of clarity, said transistors are not shown in detail in FIG. 1. The substrate 1 comprises electrically conducting structures 2 via which the transistors are electrically connected to storage capacitors to be produced by the process according to the invention. Provided at the surface of the substrate 1 is an insulating layer 3 which completely covers the electrically conducting structures 2 and other electrically conducting components which are not shown. The insulating layer 3 essentially comprises $SiO_2$.

Figure 2:
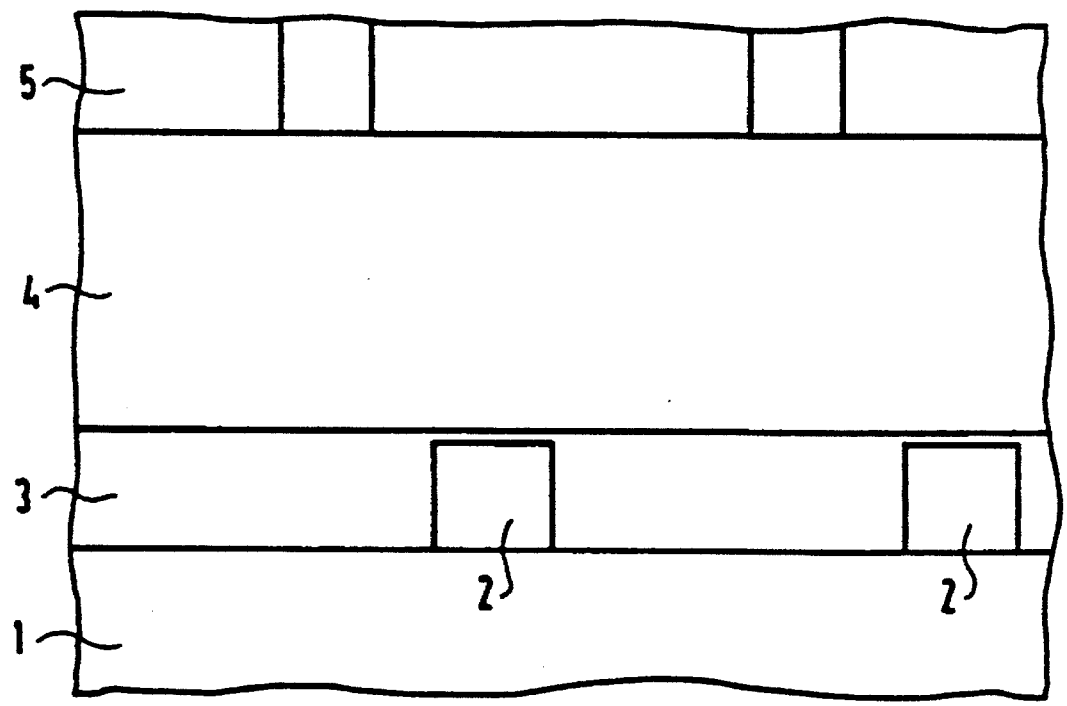
FIG. 2 shows the substrate after depositing a first auxiliary layer.
Figure 3:
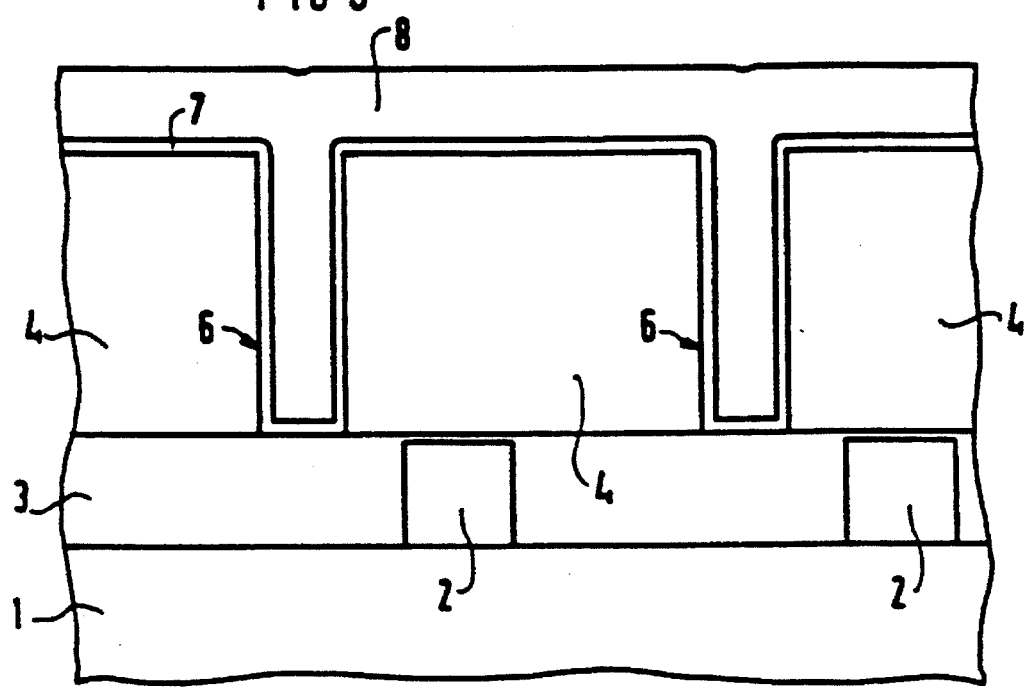
FIG. 3 shows the substrate after depositing a second auxiliary layer.

A first auxiliary layer 4 is deposited over the entire surface on the insulating layer 3 (see FIG. 2). The first auxiliary layer 4 of polysilicon is deposited, for example, by CVD deposition. The first auxiliary layer 4 is deposited in a thickness of, for example, 1μm. The thickness of the first auxiliary layer 4 determines the height of the cylindrical side areas of the storage nodes to be produced subsequently. A photoresist mask 5 is deposited on the first auxiliary layer 4. The photoresist mask 5 is produced by depositing a photoresist layer, exposing and developing the photoresist layer. In a dry etching step, for example with HBr, $Cl_2$, $C_2F_6$, the first auxiliary layer 4 is structured using the photoresist mask 5 as etching mask (see FIGS. 2 and 3). In this process, openings 6 are formed in the first auxiliary layer 4. The openings 6 extend in each case between sites at which storage nodes of adjacent storage capacitors are later produced. The residual first auxiliary layer 4 covers those regions of the surface of the insulating layer 3 which are later covered by storage nodes.

An $Si_3N_4$ layer 7 is then deposited over the entire surface in a thickness of, for example, 20 nm. A second auxiliary layer 8 is deposited on the $Si_3N_4$ layer 7 over its entire surface. The second auxiliary layer 8 is formed from $SiO_2$. The second auxiliary layer 8 is deposited in a thickness which is such that the openings 6 are completely filled with $SiO_2$. The thickness is, for example, 200 nm. The second auxiliary layer 8 is deposited, for example, conformally.

Figure 4:
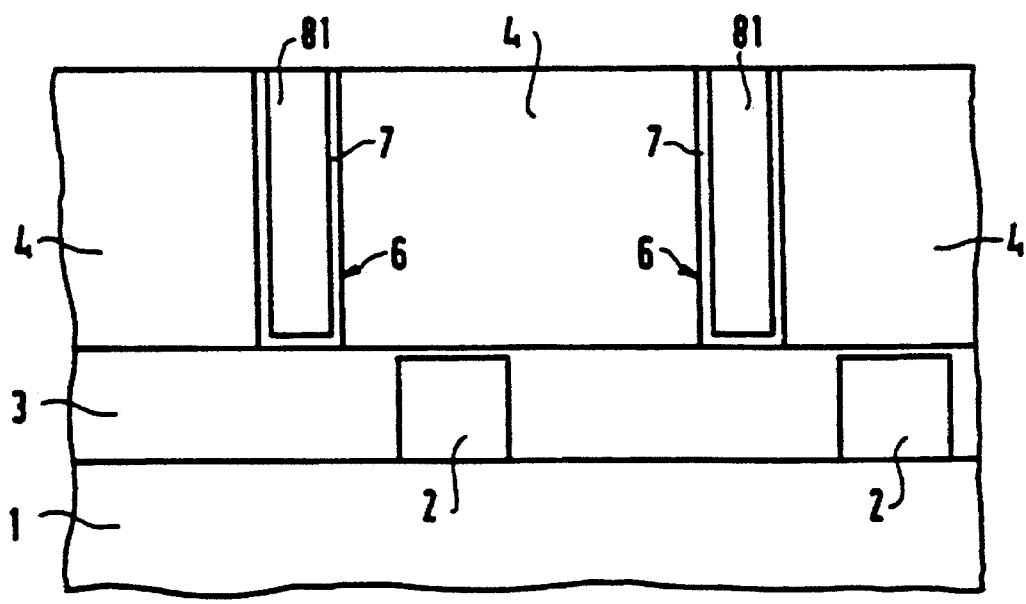
FIG. 4 shows the substrate after forming dummies.

In a dry etching step using, for example, $CHF_3/O_2$, the second auxiliary layer 8 outside the openings 6 is removed. In this process, the surface of the $Si_3N_4$ layer 7 is first exposed. In the same etching step, the $Si_3N_4$ layer 7 is removed from the horizontal surfaces of first auxiliary layer 4 of polysilicon. The etching processes each take place selectively with respect to polysilicon. The openings 6 continue to be filled with dummy 81 of $SiO_2$, which dummy is the remnant of the second auxiliary layer 8 left over. Disposed between the dummy 81 and the surrounding first auxiliary layer 4 and the insulating layer 3 situated thereunder is $Si_3N_4$ of the $Si_3N_4$ layer 7 (see FIG. 4).

The first auxiliary layer 4 is then removed by wet-chemical etching using, for example, choline. This etching step takes place selectively with respect to $SiO_2$ and $Si_3N_4$. The fact that the insulating layer 3 is disposed over the entire surface underneath the first auxiliary layer 4 ensures during the removal of the first auxiliary layer 4 that no uncontrolled etching into the insulating layer 3 takes place. The $SiO_2$ acts as an etch stop in the wet-chemical etching.

In a dry etching process, the insulating layer 3 is then removed above the electrically conducting structures 2 in order to open a contact to the latter. The preprocessing must ensure that said dry etching process cannot produce any unwanted short circuits in $SiO_2$. This is done, in particular, by adjusting the layer thickness of the insulating layer 3.

Figure 5:
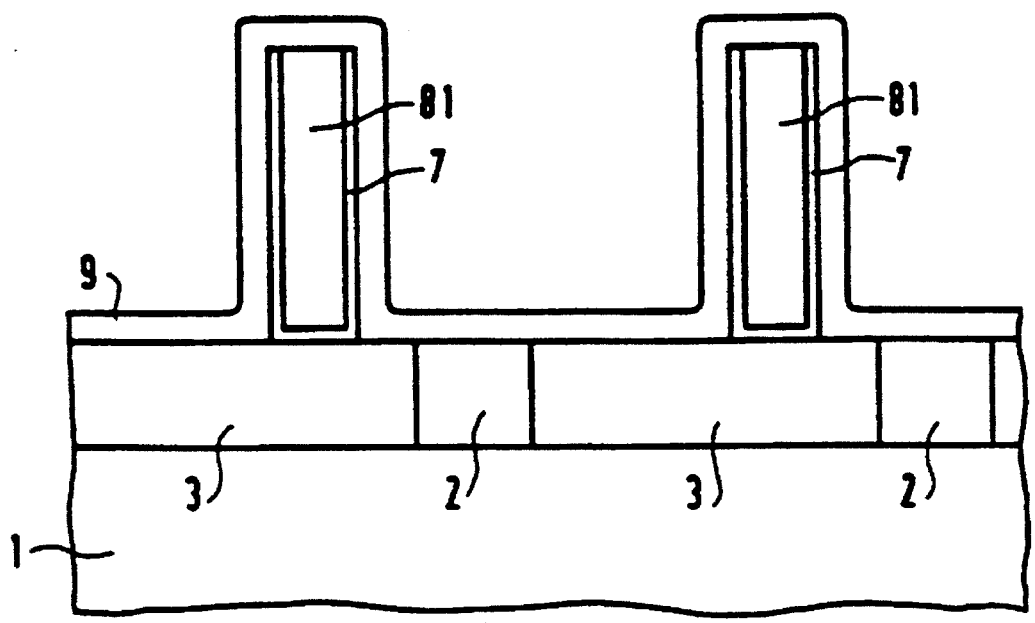
FIG. 5 shows the substrate after depositing a doped polysilicon layer.

A doped polysilicon layer 9 is deposited over the entire surface in a thickness of, for example, 100 nm. The doped polysilicon layer 9 is deposited essentially conformally and covers the dummy 81 completely (see FIG. 5).

Figure 6:
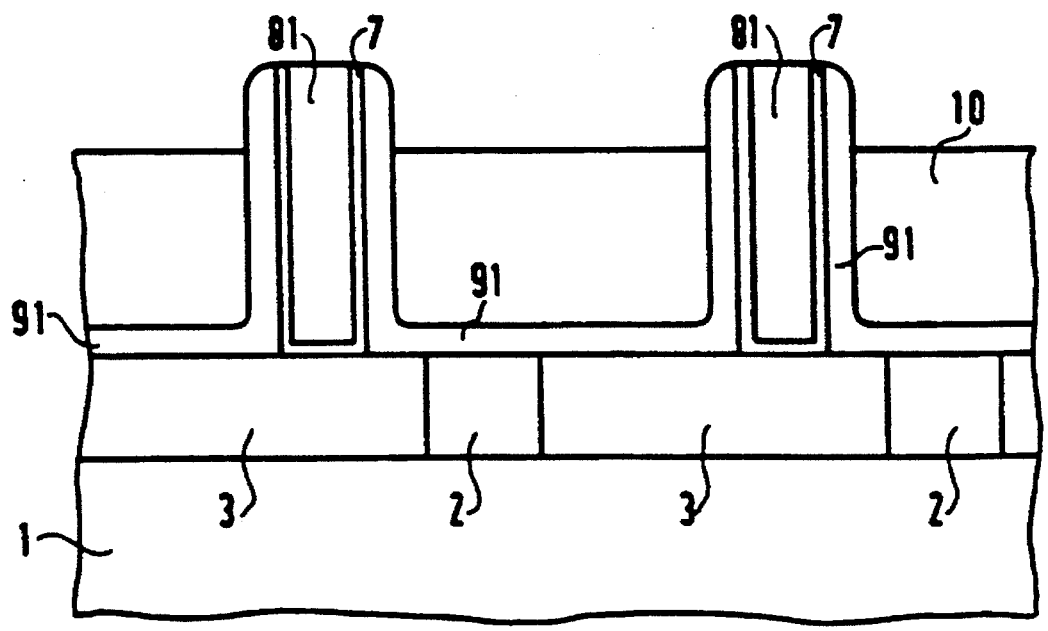
FIG. 6 shows the substrate after forming storage nodes.

A photoresist layer which completely covers the doped polysilicon layer 9 is then deposited over the entire surface. The photoresist layer is back-exposed and developed. During the back-exposure, the photoresist layer is only exposed down to a predeterminable depth so that only the upper pan of the photoresist layer is removed during development. The photoresist layer is exposed to such an extent that a developed photoresist layer 10 is produced which leaves uncovered the upper part of the dummies 81 covered by the doped polysilicon layer 9 (see FIG. 6). In an anisotropic dry etching process, the doped polysilicon layer 9 is then structured in such a way that the horizontal surface of the dummy 81 and of the surrounding $Si_3N_4$ of the $Si_3N_4$ layer 7 is exposed. In this process, storage nodes 91 are produced.

After removal of the developed photoresist layer 10, the dummies 81 are removed selectively with respect to $Si_3N_4$ and polysilicon in an etching step employing $NH_4F$, HF (5:1). In this process, the $Si_3N_4$ acts as an etch stop. In a wet-chemical etching process employing $HNO_3$, the residual part of the $Si_3N_4$ layer 7 is then completely removed. During the removal of the dummies 81, the $Si_3N_4$ acts as an etch stop. In applications in which a precise adjustment of the depth to which the dummy 81 is removed is not important, the $Si_3N_4$ layer 7 maybe dispensed with. This results in a simplification of the process.

A storage dielectric is produced over the entire surface, for example, by producing thermal $SiO_2$, $Si_3N_4$ and thermal $SiO_2$. A cell plate 12 of doped polysilicon is produced over the entire surface on the storage dielectric 11.

Figure 7:
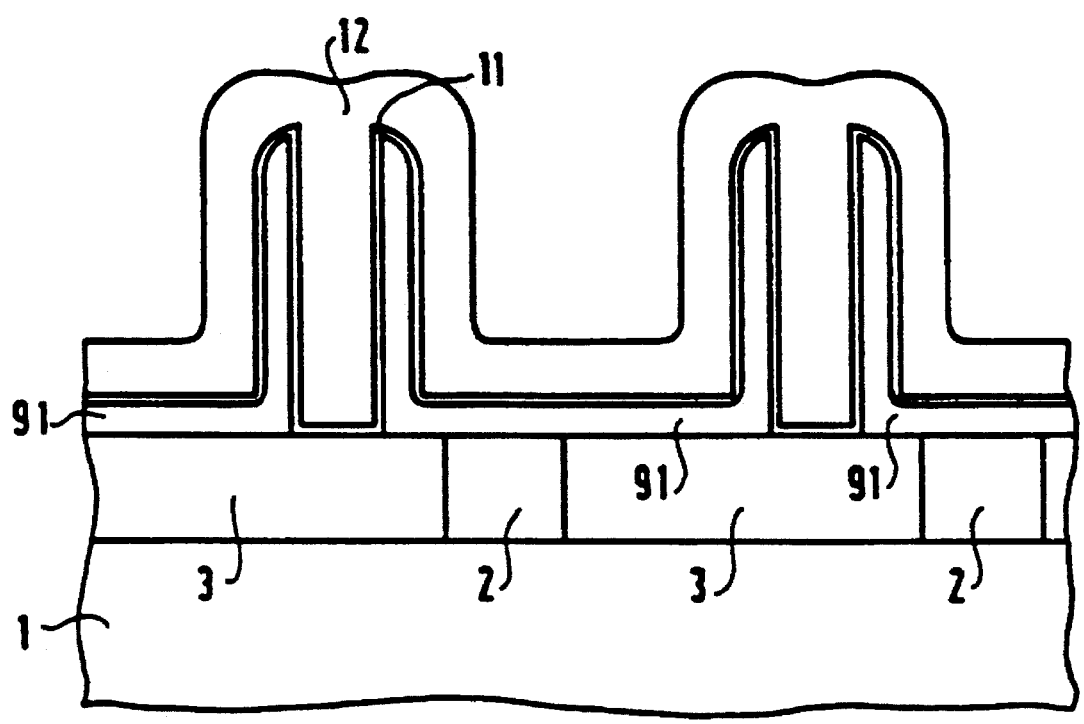
FIG. 7 shows the substrate together with storage capacitors formed by the production process according to the invention.

The size of the individual storage capacitors is determined by the geometry of the storage nodes 91 (see FIG. 7). In this connection, the storage capacitor comprises not only the surface of the base area of the storage node 91 but also the surface of the inside and outside of the cylindrical part of the storage nodes 91. The storage nodes are connected at the appropriate transistors via the electrically conducting structures 2.

For the sake of clarity, the invention was explained by reference to an exemplary embodiment in which the insulating layer 3 has a flat surface. The process according to the invention can be analogously applied if the insulating layer is provided with a surface topology.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing storage capacitors for DRAM cells, comprising the steps of:

providing a substrate having a surface entirely covered by $SiO_2$;

depositing a first auxiliary layer of polysilicon over an entire surface of the $SiO_2$ on the substrate;

structuring the first auxiliary layer in accordance with an arrangement of the storage capacitors, so that the first auxiliary layer has openings which in each case surround storage nodes of adjacent storage capacitors;

depositing a second auxiliary layer of $SiO_2$ over an entire surface of the first auxiliary layer, the openings in the first auxiliary layer being filled with $SiO_2$;

back-etching the second auxiliary layer selectively with respect to the first auxiliary layer, so that the surface of the first auxiliary layer is exposed and dummy portions of $SiO_2$ are left behind in the openings;

completely removing the first auxiliary layer selectively with respect to $SiO_2$;

depositing surface-wide a doped polysilicon layer and structuring the doped polysilicon layer to form storage nodes such that a bottom area defined by the dummy patterns and side walls of the dummy patterns are covered with the storage nodes and the surface of the dummy patterns is in each case exposed in an upper region of the dummy patterns;

substantially removing the dummy patterns selectively with respect to the storage nodes; and producing surface-wide a storage dielectric and producing a conductive layer as a cell plate.

2. The method according to claim 1, wherein prior to the deposition of the doped polysilicon layer for forming the storage nodes, the method further comprises opening in the $SiO_2$ at the surface of the substrate contact holes via which the storage nodes are electrically connected to electrically conducting structures disposed in the $SiO_2$ at the surface of the substrate.

3. The method according to claim 1, wherein the method further comprises:

after deposition of the doped polysilicon layer for forming the storage nodes, depositing a photoresist layer which completely covers the doped polysilicon layer, back-exposing and developing the photoresist layer is back-exposed and developed, so that only the upper part of the dummy patterns covered with the doped polysilicon layer is exposed, and in a anisotropic dry etching process, structuring the doped polysilicon layer selectively with respect to $SiO_2$, in which process horizontal areas of the dummy patterns are exposed.

4. The method according to claim 1, wherein the method further comprises:

after structuring the first auxiliary layer prior to the deposition of the second auxiliary layer, depositing an $Si_3N_4$ layer which is thinner than half the width of the openings in the first auxiliary layer, during the back-etching of the second auxiliary layer, exposing the surface of the $Si_3N_4$ layer in the region of the first auxiliary layer, selectively carrying out an $Si_3N_4$ etching process with respect to polysilicon, in which process the surface of the first auxiliary layer is exposed, after forming the storage nodes, removing the dummy patterns by an $SiO_2$ etching process which is selective with respect to $Si_3N_4$, and selectively carrying out an $Si_3N_4$ etching process with respect to polysilicon and $SiO_2$, in which process the remnants of the $Si_3N_4$ layer are removed.

5. The method according to claim 1, wherein structuring the first auxiliary layer using a photoresist mask in a dry etching process.

6. The method according to claim 1, wherein the method further comprises forming the second auxiliary layer is formed by conformal deposition.

7. The method according to claim 1, wherein the method further comprises forming the storage dielectric as a multi-layer of thermal $SiO_2$, $Si_3N_4$ and thermal $SiO_2$.

8. The method according to claim 1, wherein the method further comprises forming the cell plate from doped polysilicon.

9. The method according to claim 1, wherein the method further comprises prior to the deposition of the first auxiliary layer, producing transistors with bit lines and word lines for stacked-capacitor DRAM cells in the substrate.

\* \* \* \* \*